(12) United States Patent
Ijima et al.

(10) Patent No.: US 12,076,967 B2
(45) Date of Patent: Sep. 3, 2024

(54) METAL JOINT, METAL JOINT PRODUCTION METHOD, SEMICONDUCTOR DEVICE, AND WAVE GUIDE PATH

(71) Applicant: Mitsubishi Electric Corporation, Tokyo (JP)

(72) Inventors: Takashi Ijima, Tokyo (JP); Koji Yamazaki, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 785 days.

(21) Appl. No.: 17/264,873

(22) PCT Filed: Sep. 25, 2018

(86) PCT No.: PCT/JP2018/035292
§ 371 (c)(1),
(2) Date: Feb. 1, 2021

(87) PCT Pub. No.: WO2020/065700
PCT Pub. Date: Apr. 2, 2020

(65) Prior Publication Data
US 2021/0305194 A1    Sep. 30, 2021

(51) Int. Cl.
*B32B 37/06* (2006.01)
*B23K 103/12* (2006.01)
*H01L 23/00* (2006.01)

(52) U.S. Cl.
CPC ............. *B32B 37/06* (2013.01); *H01L 24/29* (2013.01); *H01L 24/32* (2013.01); *H01L 24/83* (2013.01);
(Continued)

(58) Field of Classification Search
CPC ......... H01L 24/29; H01L 24/32; H01L 24/83; B32B 37/06
(Continued)

(56) References Cited

U.S. PATENT DOCUMENTS

| 2014/0030634 A1* | 1/2014 | Nanbu | ............... B23K 20/00 |
| | | | 428/654 |
| 2015/0001280 A1* | 1/2015 | Nakagawa | ......... B23K 35/282 |
| | | | 228/164 |
| 2017/0014942 A1 | 1/2017 | Nanbu et al. | |

FOREIGN PATENT DOCUMENTS

| CN | 1092903 A | 9/1994 |
| CN | 102489871 A | 6/2012 |

(Continued)

OTHER PUBLICATIONS

International Search Report and Written Opinion mailed on Nov. 27, 2018, received for PCT Application PCT/JP2018/035292, Filed on Sep. 25, 2018, 7 pages including English Translation.
(Continued)

*Primary Examiner* — Jasmine J Clark
(74) *Attorney, Agent, or Firm* — XSENSUS LLP

(57) ABSTRACT

Provided is a metal joint (5) including: a Ag—Cu—Zn layer (7); and Cu—Zn layers (6) joined to both surfaces of the Ag—Cu—Zn layer (7), wherein the Ag—Cu—Zn layer (7) has a composition in which a Cu component is 1 atm % or more and 10 atm % or less, a Zn component is 1 atm % or more and 40 atm % or less, and the balance is a Ag component with respect to the total 100 atm %, and wherein the Cu—Zn layers (6) have a composition in which a Zn component is 10 atm % or more and 40 atm % or less and the balance is a Cu component with respect to the total 100 atm %. It is therefore possible to obtain the metal joint (5), which is capable of joining metal base materials to each
(Continued)

other without being limited to aluminum-based materials, and also have high mechanical strength.

3 Claims, 6 Drawing Sheets

(52) U.S. Cl.
CPC ....... *B23K 2103/12* (2018.08); *B32B 2311/08* (2013.01); *B32B 2311/12* (2013.01); *B32B 2311/20* (2013.01); *H01L 2224/2908* (2013.01); *H01L 2224/29083* (2013.01); *H01L 2224/32245* (2013.01); *H01L 2224/32503* (2013.01); *H01L 2224/83801* (2013.01)

(58) Field of Classification Search
USPC .......................................................... 257/44
See application file for complete search history.

(56) References Cited

FOREIGN PATENT DOCUMENTS

| CN | 103035419 A | 4/2013 |
|---|---|---|
| JP | 2015-155108 A | 8/2015 |
| WO | 2006/098233 A1 | 9/2006 |
| WO | 2015/152040 A1 | 10/2015 |

OTHER PUBLICATIONS

Office Action issued on Dec. 28, 2021, in corresponding Chinese patent Application No. 201880097386.9, 16 pages.

* cited by examiner

FIG.2

| | JOINING TEMPERATURE (°C) | PRESSURIZING FORCE (MPa) | JOINING TIME PERIOD (hr) | JOINT AREA RATIO (%) | JOINT STRENGTH (MPa) | JOINT STRENGTH RATIO (RATIO TO Ag-ONLY FILM) | Zn RATIO IN Cu-Zn FILM (atm%) | Cu RATIO IN Ag-Cu-Zn FILM (atm%) | Zn RATIO IN Ag-Cu-Zn FILM (atm%) |
|---|---|---|---|---|---|---|---|---|---|
| EXAMPLE1 | 350 | 20 | 0.5 | 51 | 208 | 1.85 | 36 | 3.6 | 2 |
| EXAMPLE2 | 350 | 20 | 1 | 65 | 219 | 1.53 | 34 | 3.9 | 2.2 |
| EXAMPLE3 | 350 | 20 | 2 | 85 | 288 | 1.54 | 21 | 9.2 | 4.2 |
| EXAMPLE4 | 350 | 20 | 3 | 92 | 269 | 1.33 | 20.2 | 9.7 | 23.4 |
| EXAMPLE5 | 300 | 20 | 2 | 43 | 109 | 1.15 | 35.5 | 2.1 | 1.6 |
| EXAMPLE6 | 400 | 20 | 2 | 88 | 257 | 1.33 | 18.5 | 9.3 | 27.6 |
| COMPARATIVE EXAMPLE1 | 350 | 20 | 0.2 | 18 | 30 | 0.76 | 39 | 0.8 | 0.7 |
| COMPARATIVE EXAMPLE2 | 350 | 20 | 8 | 93 | 101 | 0.49 | 13.4 | 16.3 | 36.7 |
| COMPARATIVE EXAMPLE3 | 250 | 20 | 2 | 15 | 30 | 0.91 | 36 | 1.1 | 0.7 |
| COMPARATIVE EXAMPLE4 | 450 | 20 | 2 | 93 | 162 | 0.79 | 12.3 | 14.3 | 43.2 |

METAL JOINT, METAL JOINT PRODUCTION METHOD, SEMICONDUCTOR DEVICE, AND WAVE GUIDE PATH

CROSS-REFERENCE TO RELATED APPLICATION

The present application is based on PCT filing PCT/JP2018/035292, filed Sep. 25, 2018, the entire contents of which are incorporated herein by reference.

TECHNICAL FIELD

The present invention relates to a metal joint for use in a semiconductor device, a waveguide, and the like, and to a metal joint manufacturing method.

BACKGROUND ART

Solder bonding is generally used as a method of joining metals, for example, metal wiring members, to each other in a semiconductor device. In recent years, semiconductor devices using silicon carbide (SiC), gallium nitride (GaN), or other materials that are small in power attenuation in a semiconductor element are actively being developed from the viewpoint of energy saving. This type of semiconductor element is operable at as high a temperature as 200° C. or more, and the operation temperature of a semiconductor device is accordingly rising year after year. In this circumstance, it is difficult to secure heat resistance and life-span reliability with existing solder bonding. As a joining method alternative to solder bonding, a joining method using a sintered metal or metal paste has been proposed. However, the sintered metal and metal paste form a joining layer that is lower in strength than members to be joined or that is porous, and are therefore characteristically susceptible to breakage, which leaves an issue in improving life-span reliability.

Meanwhile, in a waveguide for an antenna for millimeter wave communication in a 30 GHz to 300 GHz band, or other uses, screw fastening, solder bonding, or brazing is used as a method of fastening metal members to each other. However, in screw fastening, flared portions for fastening with a screw are required, and lead to size expansion and an increase in weight. Solder bonding has problems of a lack of strength of a solder material itself and overflowing of the solder material to portions other than a joining portion. Further, the brazing has a problem of thermal deformation of a waveguide member due to heating in brazing.

A joining method utilizing solid-phase diffusion of metal has been proposed as a method alternative to existing methods of joining metals to each other. For instance, there is disclosed a metal joint in which aluminum-based base materials are joined to each other by forming Ag layers and Sn layers on surfaces of the aluminum-based base materials, and then bringing the Sn layers into contact with each other and applying pressure and heat to the Sn layers to form a Al—Ag—Sn layer in a joining portion (see, for example, Patent Literature 1).

CITATION LIST

Patent Literature

[PTL 1] JP 2015-155108 A (see pp. 4 to 6, FIG. 1)

SUMMARY OF INVENTION

Technical Problem

With the related-art method of joining metals to each other, however, the base materials are limited to aluminum-based materials, and the method cannot be used for base materials of other types of metal, for example, copper and iron. In addition, the Ag layers and Sn layers formed on the surfaces of the base materials are prone to contact corrosion between different types of metal, due to a difference in oxidation-reduction potential, and consequently have a problem in use in a highly humid environment and an environment in which salt is present. Further, the joining portion containing Sn is lower in mechanical strength than a joining portion formed solely of Al or Ag.

The present invention has been made to solve the problems described above, and an object of the present invention is therefore to obtain a metal joint that can join metal base materials to each other without being limited to aluminum-based materials, and that is affected little by contact corrosion between different types of metal and is accordingly high in mechanical strength.

Solution to Problem

According to the present invention, there is provided a metal joint including: a Ag—Cu—Zn layer; and Cu—Zn layers joined to both surfaces of the Ag—Cu—Zn layer, wherein the Ag—Cu—Zn layer has a composition in which a Cu component is from 1 atm % or more and 10 atm % or less, a Zn component is from 1 atm % or more and 40 atm % or less, and balance is a Ag component with respect to the total 100 atm %, and wherein the Cu—Zn layers have a composition in which a Zn component is from 10 atm % or more and 40 atm % or less and balance is a Cu component with respect to the total 100 atm %.

Further, according to the present invention, there is provided a metal joint manufacturing method of forming a metal joint by joining laminates in each of which a Cu—Zn layer, a Cu layer, and a Ag layer are formed in order, the metal joint manufacturing method including the steps of: bringing the Ag layer of one of the laminates and the Ag layer of the other of the laminates into contact with the Ag layers facing each other; and performing heat treatment at a temperature of 300° C. or more and 400° C. or less on the laminates under pressure with the Ag layers being brought into contact with each other.

Advantageous Effects of Invention

The metal joint according to the present invention has the Cu—Zn layers joined to both surfaces of the Ag—Cu—Zn layer, which enables the metal joint to join metal base materials to each other without being limited to aluminum-based materials, and also gives the metal joint high mechanical strength.

The metal joint joining method according to the present invention decreases the effect of contact corrosion between different types of metal because the Cu layer and the Ag layer are layered in order.

BRIEF DESCRIPTION OF DRAWINGS

FIG. 2 is a tabulated list for showing characteristics of the metal joint according to the first embodiment of the present invention.

DESCRIPTION OF EMBODIMENTS

First Embodiment

Figure 1A:
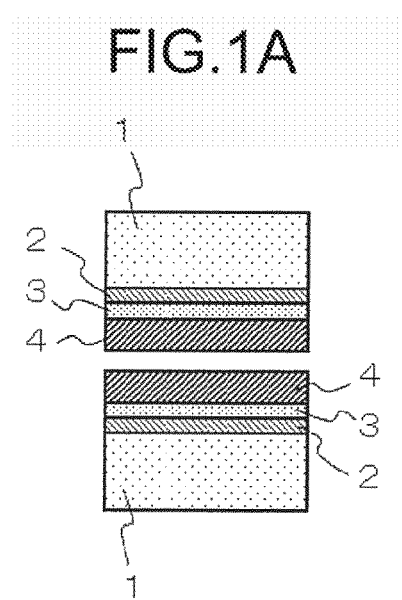
FIGS. 1A-1C are explanatory diagrams for illustrating a joining method for a metal joint according to a first embodiment of the present invention.
Figure 1B:
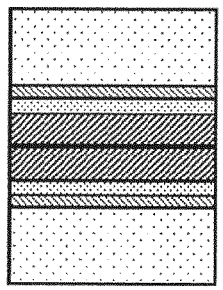
Figure 1C:
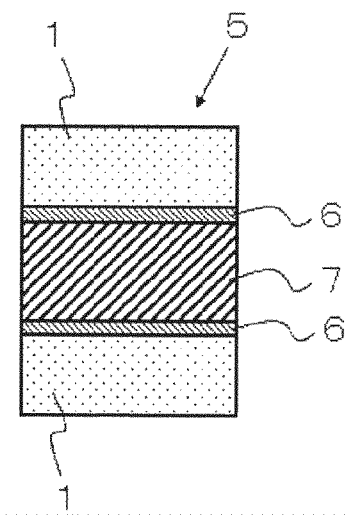

FIGS. 1A-1C are explanatory diagrams for illustrating a joining method for a metal joint according to a first embodiment for carrying out the present invention. The metal joint illustrated in FIG. 1A is in a state observed prior to the start of joining, in which a Cu—Zn layer 2, a Cu layer 3, and a Ag layer 4 are formed in order on a surface of each base material 1 made of metal. In FIG. 1B a state in which the Ag layer 4 of one base material 1 and the Ag layer of the other base material 1 are brought into contact with each other is illustrated. Each base material 1 made of metal is a block having the shape of, for example, a cube, and metal layers are formed in order partially or entirely on the surface of the base material 1 made of metal.

Heat treatment at a temperature of 300° C. or more and less than 400° C. is performed under pressure in the state illustrated in FIG. 1B for solid-phase bonding at the Cu—Zn layer 2, the Cu layer 3, and the Ag layer 4. FIG. 1C is an illustration of a metal joint 5, which is a final product completed by solid-phase bonding. In this metal joint 5, one base material 1 and the other base material 1 are joined to each other at Cu—Zn layers 6 and a Ag—Cu—Zn layer 7. Solid-phase bonding means joining base materials by heating metal layers that are layered on surfaces of the base materials in a solid phase (solid state) so that the metal layers are softened and not melted, and further applying pressure to give the metal layers plastic deformation.

The Cu—Zn layers 6 formed by solid-phase bonding are each a layer that is overall a Cu—Zn alloy created as a result of the movement of Zn atoms between the Cu—Zn layer 2 and Cu layer 3 illustrated in FIG. 1A. The Ag—Cu—Zn layer 7 formed by solid-phase bonding is a layer of a Ag—Cu—Zn alloy created as a result of the movement of Cu atoms and Zn atoms from the Cu—Zn layer 2 and the Cu layer 3 to the Ag layer 4 illustrated in FIG. 1A. In this process, Ag atoms hardly move from the Ag layer 4 to the Cu layer 3 and the Cu—Zn layer 2.

A preferred condition of the pressurization is 0.1 MPa or more and 200 MPa or less so that the base materials are not deformed. In particular, 0.5 MPa or more and 100 MPa or less is preferred in order to balance utilization of a benefit to joining that is brought about by softening and deforming the metal layers on a joint interface and suppression of a negative aspect that is deformation of a parent material on which the metal layers are formed, although effects on the shapes of the base materials and others in a heated state are required to be taken into consideration. The time period required for joining may be suitably set based on the heating temperature and the pressurizing force, but is generally 1 minute or more and less than 12 hours. A preferred joining time period is 10 minutes or more and 3 hours or less. After the Cu—Zn layers and the Ag—Cu—Zn layer are formed by solid-phase bonding, heating is stopped and it is preferred to let the metal joint cool down by natural heat dissipation.

Examples of the method of forming the Cu—Zn layer 2, the Cu layer 3, and the Ag layer 4 include electrolytic plating, non-electrolytic plating, physical vapor deposition (PVD), chemical vapor deposition (CVD), and sputtering. A desired film thickness of the Cu—Zn layer 2 is from 0.1 μm to 5 μm, a desired film thickness of the Cu layer 3 is from 0.1 μm to 5 μm, and a desired film thickness of the Ag layer 4 is from 0.1 μm to 15 μm.

The base material 1 made of metal is not particularly limited, and the metal, such as copper, iron, stainless steel, aluminum, or zinc or an alloy thereof may be used.

The metal joint according to this embodiment is described in more detail below through Examples and Comparative Examples.

Two members were prepared by forming, for each of the members, a Cu—Zn layer on a surface of a Cu base material, forming a Cu layer on a surface of the Cu—Zn layer, and forming a Ag layer on a surface of the Cu layer. The film thickness of the Cu—Zn layer was set to 5 μm, and the Cu—Zn layer was given a composition ratio in which the ratio of Zn atoms was 40 atm %. The film thickness of the Cu layer was set to 1 μm, and the film thickness of the Ag layer was set to 5 μm. The metal layers were formed by sputtering. The two members were subjected to pressurization under the atmospheric pressure and heating, with the Ag layer of one member and the Ag layer of the other member being in close contact with each other, to thereby fabricate a metal joint through solid-phase bonding. Pressurization and heating conditions of each of samples (Examples and Comparative Examples) are described later.

In this embodiment, a Cu—Zn layer means an alloy layer having Cu and Zn as main components, a Cu layer means a layer having Cu as a main component, and a Ag layer means a layer having Ag as a main component. In each of those layers, the content of the main component(s) of the layer is preferred to be 99% by mass or more by itself, but the balance can contain inevitable impurities without causing a problem.

The thus fabricated samples were measured in joint strength with the use of a tensile tester (4400R, a product of Instron). The samples subjected to tensile testing were different from the metal-made base materials described above, and were measured in joint strength. The samples subjected to tensile testing were shaped by taking a testing jig into consideration, and were each two round rods made of Cu with a diameter of 10 mm and a height of 10 mm, and laid on top of each other and joined to each other with metal layers of the relevant Example or Comparative Example being formed on circular sectional surfaces of the round rods. Conditions of the joining were the same as the joining conditions of the base materials made of metal. The tensile direction thereof is a direction perpendicular to a joint surface, namely, the longitudinal direction of the round rods. As a reference for joint strength, a sample in which a Ag layer alone was formed as a metal layer was fabricated as well, and measured in joint strength. The measured joint strength of the sample was 220 MPa.

A joint area ratio is defined as the ratio of the area of a fracture surface to the area of a joint surface of a target member. The joint area ratio of each of the samples was calculated from a calculated area of a dimple-formed surface, in which surface irregularity was caused on the fracture surface by fracturing due to tensile testing, and also from the ratio of a joining portion and a non-joining portion (gap portion) on a joining portion cross-section, which was cut perpendicular to a joint surface of another sample fabricated at the same time. The joint strengths of the samples were calculated by calculating joint strengths of a case in which the joint area ratio was 100% with the use of the following expression, and relative values of the calculated joint strengths were obtained with a joint strength of a case in which the round rods were joined at the Ag layers alone as a reference, to be compared with one another.

Joint strength-measurement value (MPa)×(100/joint area ratio (%))/220 (MPa)

When a joint strength (a relative value) obtained in this manner was larger than 1, joint reliability was determined to be high. When a joint strength obtained in this manner was equal to or smaller than 1, which means that the joint strength is the same as or less than the joint strength of Ag joining, joint reliability in this case was accordingly determined to be low.

On a cross-section perpendicular to the joint surface of each of the samples, the ratio of Zn atoms in the Cu—Zn layers and the ratio (atm %) of Cu atoms as well as the ratio (atm %) of Zn atoms in the Ag—Cu—Zn layer were measured with the use of a composition analysis function of a scanning electron microscope by wavelength-dispersive X-ray spectroscopy.

FIG. 2 is a tabulated list of Examples of this embodiment and Comparative Examples. In the table of FIG. 2, a joining temperature, a pressurizing force, and a joining time period are shown for each sample as fabrication conditions of the sample. A joint area ratio, a measured joint strength, and a joint strength (a relative value) are also shown in the table of FIG. 2. The ratio of Zn atoms in the Cu—Zn layers and the ratio of Cu atoms as well as the ratio of Zn atoms in the Ag—Cu—Zn layer are further shown.

Figure 3:
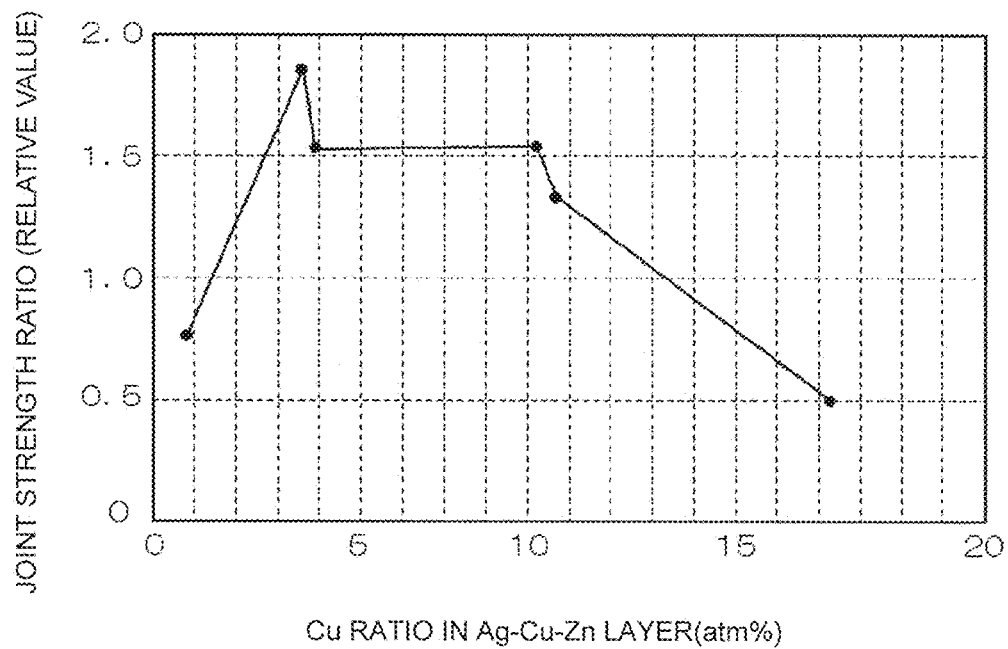
FIG. 3 is a characteristic graph of the metal joint according to the first embodiment of the present invention.

FIG. 3 is a characteristic graph for showing the joint strength ratio in relation to the ratio of Cu atoms in the Ag—Cu—Zn layer from Examples and Comparative Examples of this embodiment. Characteristic values of Examples 1 to 4 and Comparative Examples 1 and 2 of this embodiment are shown in FIG. 3. It is understood from FIG. 3 that the joint strength ratio is 1 or higher when the ratio of Cu atoms in the Ag—Cu—Zn layer is in a range of from 1 atm % to 10 atm %.

Figure 4:
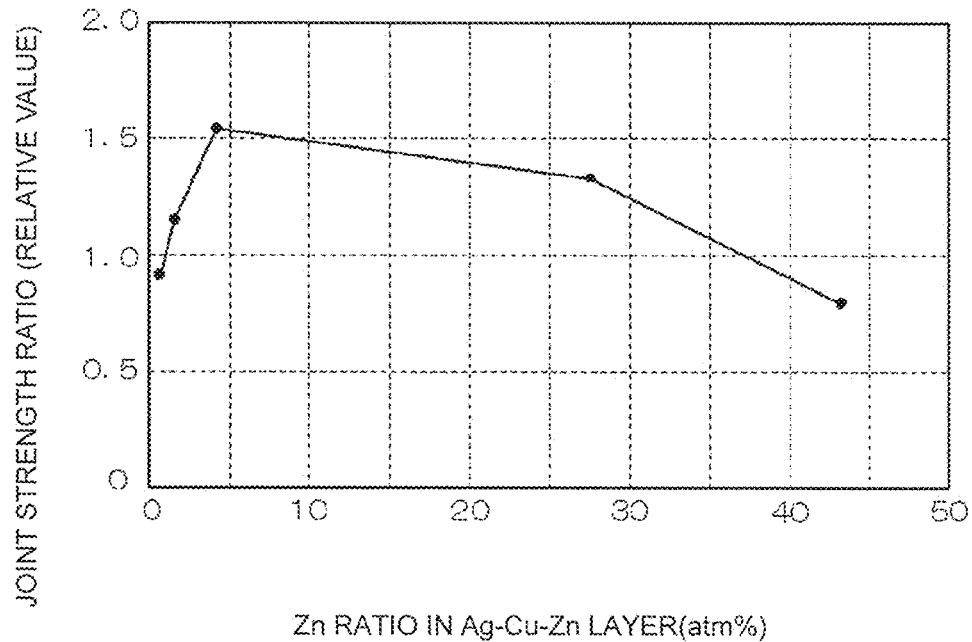
FIG. 4 is a characteristic graph of the metal joint according to the first embodiment of the present invention.

FIG. 4 is a characteristic graph for showing the joint strength ratio in relation to the ratio of Zn atoms in the Ag—Cu—Zn layer from Examples and Comparative Examples of this embodiment. Characteristic values of Examples 3, 5, and 6 and Comparative Examples 3 and 4 of this embodiment are shown in FIG. 3. It is understood from FIG. 3 that the joint strength ratio is 1 or higher when the ratio of Zn atoms in the Ag—Cu—Zn layer is in a range of from 1 atm % to 40 atm %.

In all of Examples and Comparative Examples of this embodiment, the ratio of Zn atoms in the Cu—Zn layers was in a range of from 10 atm % to 40 atm %.

It is concluded from the results given above that the metal joint of this embodiment in which the Cu—Zn layers are joined on both surfaces of the Ag—Cu—Zn layer, can obtain a joint strength exceeding the joint strength of simple Ag joining when the Ag—Cu—Zn layer has a composition in which the Cu component is 1 atm % or more and 10 atm % or less, the Zn component is 1 atm % or more and 40 atm % or less, and the balance is the Ag component, with the total being 100 atm %, and the Cu—Zn layers have a composition in which the Zn component is 10 atm % or more and 40 atm % or less and the balance is the Cu component with respect to the total of 100 atm %.

The joining method for the metal joint of this embodiment is small in the effect of contact corrosion between different types of metal because the Cu—Zn layer, the Cu layer, and the Ag layer are formed in order on the surface of each base material before joining is started.

Further, the joining method for the metal joint of this embodiment utilizes solid-phase bonding, and accordingly does not require as high a temperature as 600° C., at which the joining members are melted, or more, for a heating temperature used for heating under pressure.

Second Embodiment

Figure 5A:
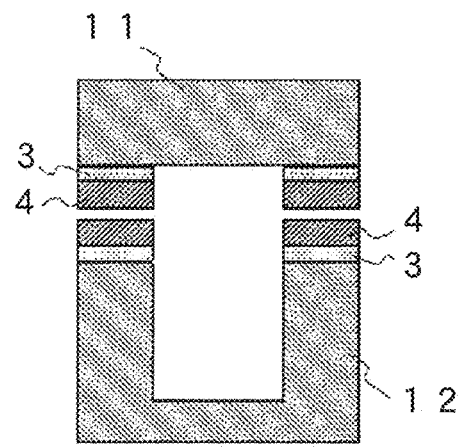
FIGS. 5A-5C are explanatory diagrams for illustrating a joining method for a waveguide according to a second embodiment of the present invention.
Figure 5B:
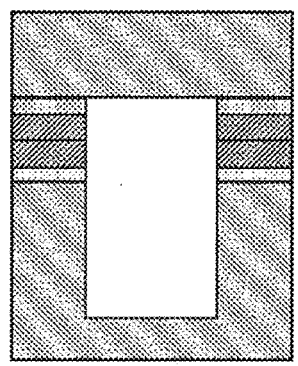
Figure 5C:
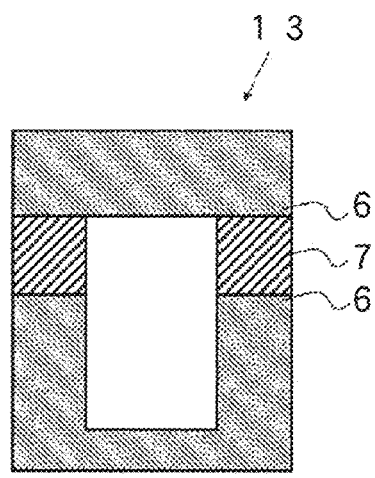

FIGS. 5A-5C are explanatory diagrams for illustrating a joining method for a waveguide according to a second embodiment for carrying out the present invention. Description of this embodiment takes as an example a rectangular waveguide (also referred to as "rectangular waveguide tube") having therein a cavity that is rectangular in cross-section.

FIGS. 5A-5C are sectional views of the waveguide in this embodiment. The waveguide in FIG. 5A is in a state observed prior to the start of joining, and includes an upper member 11 made of metal and a lower member 12, which can be joined to the upper member 11 to form a rectangular cavity inside. The upper member 11 and the lower member 12 are long in length and have a longitudinal direction in a direction along which microwaves are transmitted.

The upper member 11 and the lower member 12 are formed of brass. The brass forming the upper member 11 and the lower member 12 is a Cu—Zn-based alloy, and has a composition in which the Cu component is from 60 atm % to 70 atm %, the Zn component is from 30 atm % to 40 atm %, and the content of Pb, Fe or a similar dopant and inevitable impurities is 1 atm % or less. In this embodiment, C2600, which is brass having an approximately 70 atm % of Cu component (the Zn component is approximately 30 atm %), can be used, for example.

The Cu layer 3 and the Ag layer 4 are formed in order on each contact surface for joining the upper member 11 and the lower member 12. In the first embodiment, the Cu—Zn layer is formed under the Cu layer. In this embodiment, the upper member 11 and the lower member 12, which are members to be joined, are a Cu—Zn-based alloy, and a surface of this alloy accordingly corresponds to the Cu—Zn layer.

A state in which the Ag layer 4 of the upper member 11 and the Ag layer 4 of the lower member 12 are brought into contact with each other is illustrated in FIG. 5B. Heat treatment at a temperature of 350° C. is performed for 2 hours under pressure at a pressurizing force of 20 MPa in the state illustrated in FIG. 5B for solid-phase bonding at the Cu layer 3 and the Ag layer 4 on the surface of the upper member 11 and the Cu layer 3 and the Ag layer 4 on the surface of the lower member 12. FIG. 5C is an illustration of a waveguide 13, which is a final product completed by solid-phase bonding. In this waveguide 13, the upper member 11 and the lower member 12 are joined at the Cu—Zn layers 6, which are surfaces of the upper member 11 and the lower member 12, and the Ag—Cu—Zn layer 7.

In the thus configured waveguide, the Zn component in the Cu—Zn layers 6 is approximately 30 atm % because the composition of the Cu—Zn layers 6 is the same as the one in C2600, which forms the upper member 11 and the lower member 12. A component analysis of the Ag—Cu—Zn layer 7 revealed that this layer had a composition in which the Cu component was 4.0 atm % and the Zn component was 2.5 atm %, with the total being 100 atm %. Those component ratios are close to results of Example 2 of the first embodiment, which uses the same pressurizing condition.

The thus configured waveguide can obtain a joint strength exceeding the joint strength of simple Ag joining as in the first embodiment.

This embodiment deals with an example in which the Cu layer 3 and the Ag layer 4 are formed in order only on each contact surface for joining the upper member 11 and the lower member 12. However, when electrolytic plating, vacuum evaporation, or sputtering is employed as a method of forming the Cu layer and the Ag layer, the Cu layer and the Ag layer are actually formed on surfaces other than the contact surface as well.

Figure 6:
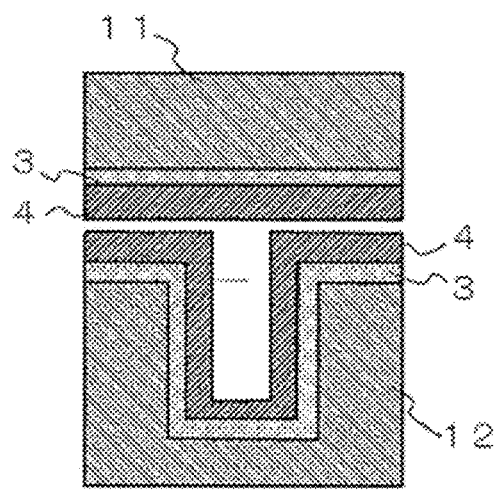
FIG. 6 is a sectional view of the waveguide according to the second embodiment of the present invention.

FIG. 6 is an illustration of another waveguide in this embodiment. The waveguide illustrated in FIG. 6 is in a state observed prior to the start of joining, in which the Cu layer 3 and the Ag layer 4 are formed in order on surfaces other than the joint surfaces of the upper member 11 and the lower member 12, which are made of metal, as well.

The steps illustrated in FIGS. 5A-5C can be used also for the manufacture of the thus configured waveguide.

The Cu layer and the Ag layer on surfaces other than the joint surfaces may be cut by machining. The forming of the Cu layer and the Ag layer on surfaces other than the joint surfaces may be prevented by masking the surfaces other than the joint surfaces when the Cu layer and the Ag layer are formed.

In this embodiment, the cavity of the waveguide is formed by combining the upper member that is shaped like a board and the lower member that has a concave shape in cross-section. However, the upper member and the lower member may both have a concave shape in cross-section.

Third Embodiment

Figure 7A:
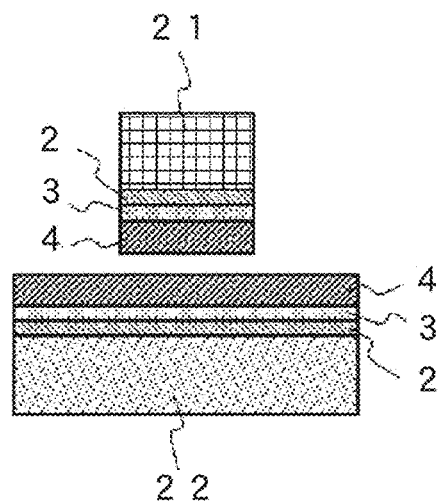
FIGS. 7A-7C are explanatory diagrams for illustrating a joining method for a semiconductor device according to a third embodiment of the present invention.
Figure 7B:
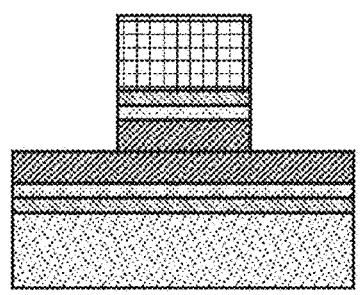
Figure 7C:
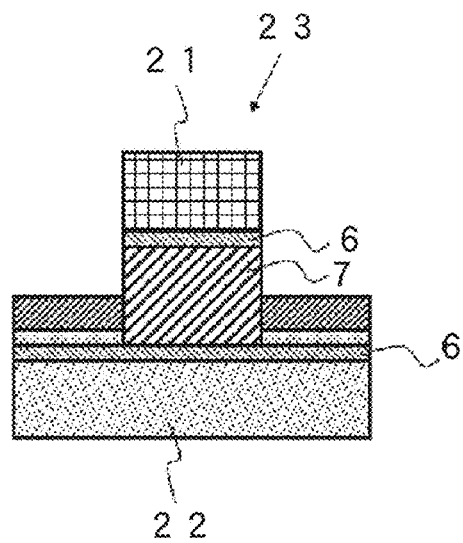

FIGS. 7A-7C are explanatory diagrams for illustrating a joining method for a semiconductor device according to a third embodiment for carrying out the present invention. The semiconductor device of this embodiment is obtained by joining a semiconductor element to an insulating substrate via a metal joint. An example of the semiconductor element is a semiconductor element containing, as a main component, silicon (Si), gallium arsenide (GaAs), silicon carbide (SiC), gallium nitride (GaN), or diamond. In addition, examples of the insulating substrate include a ceramics substrate and a direct copper bond (DCB) substrate.

FIGS. 7A-7C are sectional views of the semiconductor device of this embodiment. The semiconductor device illustrated in FIG. 7A is in a state observed prior to the start of joining, and the Cu—Zn layer 2, the Cu layer 3, and the Ag layer 4 are formed in order on a lower surface of a semiconductor element 21, namely, a surface opposed to an insulating substrate 22. Similarly, the Cu—Zn layer 2, the Cu layer 3, and the Ag layer 4 are formed in order on an upper surface of the insulating substrate 22, namely, a surface opposed to the semiconductor element 21. A state in which the Ag layer 4 of the semiconductor element 21 and the Ag layer 4 of the insulating substrate 22 are brought into contact with each other is illustrated in FIG. 7B. Heat treatment at a temperature of 350° C. is performed for 2 hours under pressure at a pressurizing force of 20 MPa in the state illustrated in FIG. 7B for solid-phase bonding at the Cu—Zn layers 2, the Cu layers 3, and the Ag layers 4. FIG. 7C is an illustration of a semiconductor device 23, which is a final product completed by solid-phase bonding. In this semiconductor device 23, the semiconductor element 21 and the insulating substrate 22 are joined at the Cu—Zn layers 6 and the Ag—Cu—Zn layer 7. device 23, the semiconductor element 21 and the insulating substrate 22 are joined at the Cu—Zn layers 6 and the Ag—Cu—Zn layer 7.

The thus configured semiconductor device can obtain a joint strength exceeding the joint strength of simple Ag joining as in the first embodiment.

In FIG. 7C, the Cu—Zn layer and the Ag—Cu—Zn layer are formed as the metal joint only on the bottom part of the semiconductor element 21. However, the Cu—Zn layer and the Ag—Cu—Zn layer are formed also on a part of the insulating substrate 22 that is not joined to the semiconductor element 21 in some cases.

Although the Cu—Zn layer 2, the Cu layer 3, and the Ag layer 4 are formed in order on the joint surface of the semiconductor element 21 in this embodiment, a Ti layer or the like may be formed between the semiconductor element 21 and the Cu—Zn layer 2 as an adhesion imparting layer.

This embodiment deals with an example of joining a semiconductor element and an insulating substrate. However, the substrate to which the semiconductor element is to be joined is not limited to an insulating substrate, and may be a Cu substrate or a Cu substrate having a surface on which Ni plating has been performed.

REFERENCE SIGNS LIST 1 base material, 2 Cu—Zn layer, 3 Cu layer, 4 Ag layer, 5 metal joint, 6 Cu—Zn layer, 7 Ag—Cu—Zn layer, 11 upper member, 12 lower member, 13 waveguide, 21 semiconductor element, 22 insulating substrate, 23 semiconductor device

The invention claimed is:

1. A metal joint, comprising:
   a Ag—Cu—Zn layer; and
   two Cu—Zn layers, each one of the Cu—Zn layers being joined to a different surface of the Ag—Cu—Zn layer,
   wherein the Ag—Cu—Zn layer has a composition in which a Cu component is from 1 atm % or more and 10 atm % or less, a Zn component is from 1 atm % or more and 40 atm % or less, and the balance is a Ag component with respect to the total 100 atm %, and
   wherein each one of the Cu—Zn layers has a composition in which a Zn component is from 10 atm % or more and 40 atm % or less and the balance is a Cu component with respect to the total 100 atm %.

2. A semiconductor device, comprising a semiconductor element and an insulating substrate which are joined to each other by the metal joint of claim 1.

3. A waveguide, comprising:
   an upper member; and
   a lower member, the lower member being joined to the upper member by the metal joint of claim 1 to form a cavity together with the upper member.

* * * * *